United States Patent
Zhao et al.

(10) Patent No.: US 11,997,877 B2
(45) Date of Patent: May 28, 2024

(54) ARRAY SUBSTRATE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Huihui Zhao, Hubei (CN); Hao Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 632 days.

(21) Appl. No.: 17/261,029

(22) PCT Filed: Aug. 26, 2020

(86) PCT No.: PCT/CN2020/111420
§ 371 (c)(1),
(2) Date: Jan. 18, 2021

(87) PCT Pub. No.: WO2022/011791
PCT Pub. Date: Jan. 20, 2022

(65) Prior Publication Data
US 2022/0320211 A1    Oct. 6, 2022

(30) Foreign Application Priority Data
Jul. 13, 2020 (CN) .......................... 202010671364.8

(51) Int. Cl.
H10K 59/12 (2023.01)
H10K 59/121 (2023.01)
H10K 59/131 (2023.01)

(52) U.S. Cl.
CPC ..... H10K 59/1213 (2023.02); H10K 59/1216 (2023.02); H10K 59/131 (2023.02)

(58) Field of Classification Search
CPC .......... H10K 59/1213; H10K 59/1216; H10K 59/131; H10K 59/124; H10K 59/12;
(Continued)

(56) References Cited

U.S. PATENT DOCUMENTS 9,397,124 B2    7/2016  Choi et al.
10,916,185 B1 *  2/2021  Dai .......................... G09G 3/32
(Continued)

FOREIGN PATENT DOCUMENTS

CN      107195641 A     9/2017
CN      107275350 A     10/2017
(Continued)

*Primary Examiner* — Mohammad M Hoque
(74) *Attorney, Agent, or Firm* — PV IP PC; Wei Te Chung; Zhigang Ma

(57) ABSTRACT

An array substrate and a display panel are provided. A driving circuit layer of the array substrate includes a low temperature polysilicon thin film transistor and a low temperature polycrystalline oxide thin film transistor which are electrically connected with each other. A hydrogen blocking layer is formed on at least one of an upper side and a lower side of an oxide active layer of the low temperature polysilicon thin film transistor. The hydrogen blocking layer can block hydrogen ions in other film layers to invade the oxide active layer and avoid that device characteristics are drifted.

20 Claims, 11 Drawing Sheets

(58) Field of Classification Search
CPC ............. H01L 27/1255; H01L 27/1248; H01L 27/1225; H01L 27/1222
USPC ......................................................... 257/40
See application file for complete search history.

(56) References Cited

U.S. PATENT DOCUMENTS

| | | | |
|---|---|---|---|
| 2019/0096920 A1 | | 3/2019 | Zhou et al. |
| 2019/0103420 A1* | | 4/2019 | Liu ..................... H01L 27/1248 |
| 2021/0335828 A1* | | 10/2021 | Chen ................. H01L 29/42384 |

FOREIGN PATENT DOCUMENTS

| | | | | |
|---|---|---|---|---|
| CN | 107507841 | A | | 12/2017 |
| CN | 108122928 | A | | 6/2018 |
| CN | 108987480 | A | | 12/2018 |
| CN | 109768082 | A | | 5/2019 |
| CN | 109841632 | A | | 6/2019 |
| CN | 110148600 | A | | 8/2019 |
| CN | 110649043 | A | | 1/2020 |
| CN | 110707095 | A | | 1/2020 |
| CN | 114220772 | A | * | 3/2022 |
| CN | 217405428 | U | * | 9/2022 |
| CN | 115799268 | A | * | 3/2023 |

* cited by examiner

ARRAY SUBSTRATE AND DISPLAY PANEL

TECHNICAL FIELD

The present disclosure relates to a display device technology field, and more particularly to an array substrate and a display panel.

BACKGROUND

In a conventional display panel, a low temperature polysilicon thin film transistor is widely used. However, stability of the low temperature polysilicon thin film transistor is weak due to effect of technology processes and external environments. Accordingly, device performance is poor, and it is difficult to meet display requirements.

Consequently, a technical problem that the performance of the low temperature polysilicon thin film transistor in the conventional display panel is poor exists and needs to be improved.

Technical Problem

Embodiments of the present disclosure provide an array substrate and a display panel for solving the technical problem that performance of a low temperature polysilicon thin film transistor is poor.

Technical Solution

To solve the above-mentioned problem, technical schemes provided by the present disclosure are described as follows.

The present disclosure provides an array substrate, including:

a substrate;

a driving circuit layer formed on one side of the substrate and including a low temperature polysilicon thin film transistor and a low temperature polycrystalline oxide thin film transistor which are electrically connected with each other, wherein in a direction far away from the substrate, the low temperature polysilicon thin film transistor includes a polysilicon active layer, a first gate electrode, a first source electrode, and a first drain electrode in sequence, the low temperature polycrystalline oxide thin film transistor includes an oxide active layer, a second gate electrode, a second source electrode, and a second drain electrode in sequence, the first source electrode and the first drain electrode are connected to the polysilicon active layer, and the second source electrode and the second drain electrode are connected to the oxide active layer;

a hydrogen blocking layer formed on at least one of an upper side and a lower side of the oxide active layer; and a pixel electrode layer formed on one side of the driving circuit layer far away from the substrate, wherein the pixel electrode layer is patterned to form a pixel electrode, and the pixel electrode is connected to the first source electrode or the first drain electrode.

In the array substrate of the present disclosure, the driving circuit layer further includes a storage capacitor; in a direction far away from the substrate, the driving circuit layer includes the polysilicon active layer, a first gate insulating layer, a first metal layer, a second gate insulating layer, a second metal layer, a first interlayer dielectric layer, and a source/drain layer in sequence; the first metal layer is patterned to form the first gate electrode and a first electrode plate of the storage capacitor, the second metal layer is patterned to form a second electrode plate of the storage capacitor, and the source/drain layer is patterned to form the first source electrode and the first drain electrode; and the hydrogen blocking layer includes a first hydrogen blocking layer, and the first hydrogen blocking layer and at least one of the first metal layer and the second metal layer are disposed in the same layer.

In the array substrate of the present disclosure, a material of the first hydrogen blocking layer is metal.

In the array substrate of the present disclosure, the oxide active layer includes a channel region and a doped region, and a projection of the channel region on the substrate falls within a projection area of the first hydrogen blocking layer on the substrate.

In the array substrate of the present disclosure, a width of the first hydrogen blocking layer is greater than a width of the channel region for 1 micrometer to 8 micrometers, and a length of the first hydrogen blocking layer is greater than a width of the channel region for 1 micrometer to 10 micrometers.

In the array substrate of the present disclosure, the driving circuit layer further includes a driving signal line, and the driving signal line is connected to the first hydrogen blocking layer and configured to input a variable voltage to the first hydrogen blocking layer.

In the array substrate of the present disclosure, in a direction far away from the first interlayer dielectric layer, the driving circuit layer includes the oxide active layer, a third gate insulating layer, a third metal layer, a second interlayer dielectric layer, and the source/drain layer in sequence; the third metal layer is patterned to form the second gate electrode, and the source/drain layer is patterned to form the second source electrode and the second drain electrode; and the hydrogen blocking layer includes a second hydrogen blocking layer, and the second hydrogen blocking layer is formed on one side of the source/drain layer far away from the second interlayer dielectric layer.

In the array substrate of the present disclosure, the second hydrogen blocking layer covers the source/drain layer.

In the array substrate of the present disclosure, a material of the second hydrogen blocking layer is an inorganic material.

In the array substrate of the present disclosure, the material of the second hydrogen blocking layer includes at least one of silicon nitride and silicon oxide.

The present disclosure provides a display panel including an array substrate. The array substrate includes:

a substrate;

a driving circuit layer formed on one side of the substrate and including a low temperature polysilicon thin film transistor and a low temperature polycrystalline oxide thin film transistor which are electrically connected with each other, wherein in a direction far away from the substrate, the low temperature polysilicon thin film transistor includes a polysilicon active layer, a first gate electrode, a first source electrode, and a first drain electrode in sequence, the low temperature polycrystalline oxide thin film transistor includes an oxide active layer, a second gate electrode, a second source electrode, and a second drain electrode in sequence, the first source electrode and the first drain electrode are connected to the polysilicon active layer, and the second source electrode and the second drain electrode are connected to the oxide active layer;

a hydrogen blocking layer formed on at least one of an upper side and a lower side of the oxide active layer; and a pixel electrode layer formed on one side of the driving circuit layer far away from the substrate, wherein the pixel electrode layer is patterned to form a pixel electrode, and the pixel electrode is connected to the first source electrode or the first drain electrode.

In the display panel of the present disclosure, the driving circuit layer further includes a storage capacitor; in a direction far away from the substrate, the driving circuit layer includes the polysilicon active layer, a first gate insulating layer, a first metal layer, a second gate insulating layer, a second metal layer, a first interlayer dielectric layer, and a source/drain layer in sequence; the first metal layer is patterned to form the first gate electrode and a first electrode plate of the storage capacitor, the second metal layer is patterned to form a second electrode plate of the storage capacitor, and the source/drain layer is patterned to form the first source electrode and the first drain electrode; and the hydrogen blocking layer includes a first hydrogen blocking layer, and the first hydrogen blocking layer and at least one of the first metal layer and the second metal layer are disposed in the same layer.

In the display panel of the present disclosure, a material of the first hydrogen blocking layer is metal.

In the display panel of the present disclosure, the oxide active layer includes a channel region and a doped region, and a projection of the channel region on the substrate falls within a projection area of the first hydrogen blocking layer on the substrate.

In the display panel of the present disclosure, a width of the first hydrogen blocking layer is greater than a width of the channel region for 1 micrometer to 8 micrometers, and a length of the first hydrogen blocking layer is greater than a width of the channel region for 1 micrometer to 10 micrometers.

In the display panel of the present disclosure, the driving circuit layer further includes a driving signal line, and the driving signal line is connected to the first hydrogen blocking layer and configured to input a variable voltage to the first hydrogen blocking layer.

In the display panel of the present disclosure, in a direction far away from the first interlayer dielectric layer, the driving circuit layer includes the oxide active layer, a third gate insulating layer, a third metal layer, a second interlayer dielectric layer, and the source/drain layer in sequence; the third metal layer is patterned to form the second gate electrode, and the source/drain layer is patterned to form the second source electrode and the second drain electrode; and the hydrogen blocking layer includes a second hydrogen blocking layer, and the second hydrogen blocking layer is formed on one side of the source/drain layer far away from the second interlayer dielectric layer.

In the display panel of the present disclosure, the second hydrogen blocking layer covers the source/drain layer.

In the display panel of the present disclosure, a material of the second hydrogen blocking layer is an inorganic material.

In the display panel of the present disclosure, the material of the second hydrogen blocking layer includes at least one of silicon nitride and silicon oxide.

Advantageous Effects

Advantageous effects of the present disclosure are described as follows. The present disclosure provides an array substrate and a display panel. The array substrate includes a substrate, a driving circuit layer, a hydrogen blocking layer, and a pixel electrode layer. The driving circuit layer is formed on one side of the substrate and includes a low temperature polysilicon thin film transistor and a low temperature polycrystalline oxide thin film transistor which are electrically connected with each other. In a direction far away from the substrate, the low temperature polysilicon thin film transistor includes a polysilicon active layer, a first gate electrode, a first source electrode, and a first drain electrode in sequence. The low temperature polycrystalline oxide thin film transistor includes an oxide active layer, a second gate electrode, a second source electrode, and a second drain electrode in sequence. The first source electrode and the first drain electrode are connected to the polysilicon active layer. The second source electrode and the second drain electrode are connected to the oxide active layer. The hydrogen blocking layer is formed on at least one of an upper side and a lower side of the oxide active layer. The pixel electrode layer is formed on one side of the driving circuit layer far away from the substrate. The pixel electrode layer is patterned to form a pixel electrode. The pixel electrode is connected to the first source electrode or the first drain electrode. In the present disclosure, the low temperature polysilicon thin film transistor and the low temperature polycrystalline oxide thin film transistor are electrically connected with each other, and thus the driving power of the device can be decreased. The disposed hydrogen blocking layer can block hydrogen ions in other film layers to invade the oxide active layer and avoid that device characteristics are drifted. Accordingly, the stability of the thin film transistors in the array substrate is increased, and the performance of the device is improved.

DESCRIPTION OF DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

DETAILED DESCRIPTION OF EMBODIMENTS

Figure 1:
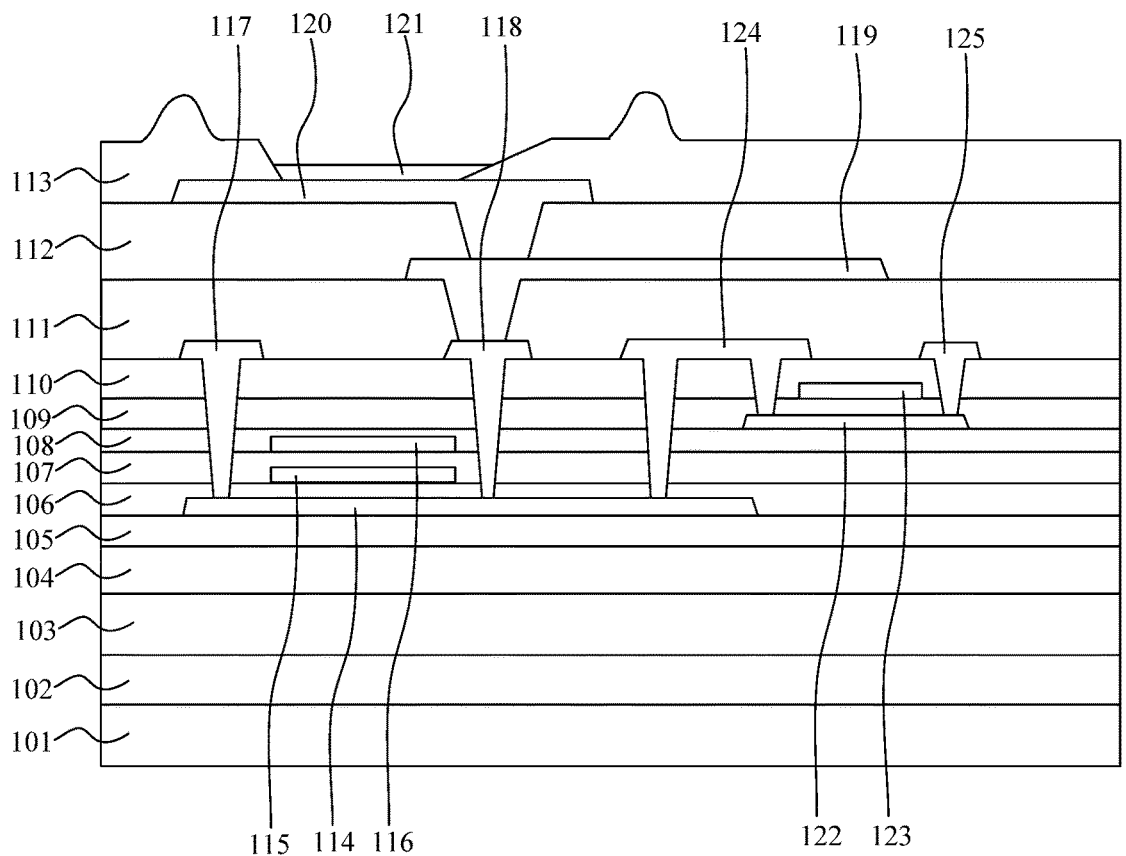
FIG. 1 illustrates a structure diagram of a display panel in the prior art.

Hereinafter, exemplary embodiments of the present disclosure will be described with reference to the accompanying drawings for illustrating specific embodiments which can be carried out by the present disclosure. The directional terms described in the present disclosure, such as upper, lower, front, rear, left, right, inner, outer, side, etc., are only directions with reference to the accompanying drawings, so that the used directional terms are used to describe and understand the present disclosure, but the present disclosure is not limited thereto. In the drawings, units with similar structures use the same numerals.

Embodiments of the present disclosure provide an array substrate and a display panel for solving the technical problem that performance of a low temperature polysilicon thin film transistor is poor.

Figure 2:
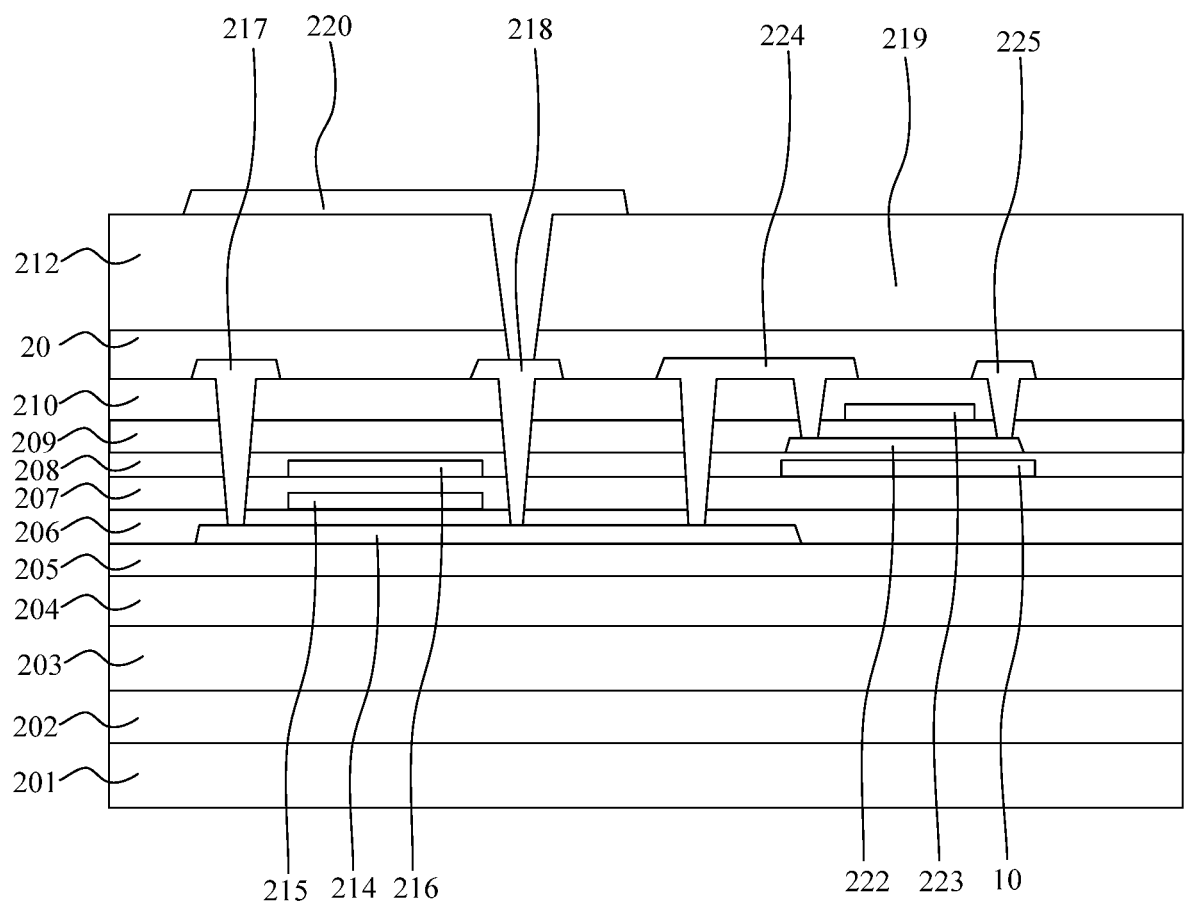
FIG. 2 illustrates a first structure diagram of an array substrate provided by an embodiment of the present disclosure.

FIG. 2 illustrates a first structure diagram of an array substrate provided by the present disclosure. The array substrate includes:

a substrate;

a driving circuit layer formed on one side of the substrate and including a low temperature polysilicon thin film transistor and a low temperature polycrystalline oxide thin film transistor which are electrically connected with each other, wherein in a direction far away from the substrate, the low temperature polysilicon thin film transistor includes a polysilicon active layer 214, a first gate electrode 215, a first source electrode 217, and a first drain electrode 218 in sequence, the low temperature polycrystalline oxide thin film transistor includes an oxide active layer 222, a second gate electrode 223, a second source electrode 224, and a second drain electrode 225 in sequence, the first source electrode 217 and the first drain electrode 218 are connected to the polysilicon active layer 214, and the second source electrode 224 and the second drain electrode 225 are connected to the oxide active layer 222;

a hydrogen blocking layer formed on at least one of an upper side and a lower side of the oxide active layer 222; and a pixel electrode layer formed on one side of the driving circuit layer far away from the substrate, wherein the pixel electrode layer is patterned to form a pixel electrode 220, and the pixel electrode 220 is connected to the first source electrode 217 or the first drain electrode 218.

The substrate may be a rigid substrate. Specifically, the substrate may be a glass substrate or one other rigid substrate. The substrate may also be a flexible substrate. In the present embodiment, the substrate is a flexible substrate and includes a first flexible substrate 201, a barrier layer 202, and a second flexible substrate 203 which are stacked up and disposed. A material of each of the first flexible substrate 201 and the second flexible substrate 203 may include at least one of polyimide, polyethylene terephthalate, polyethylene naphthalate, polycarbonate, polyarylate ester and polyethersulfone. A material of the barrier layer 202 is usually silicon oxide ($SiO_x$).

A buffer layer 204 and a blocking layer 205 are usually formed on the one side of the substrate. The driving circuit layer is formed on one side of the blocking layer 205 far away from the substrate. In the direction far away from the substrate, the polysilicon active layer 214, a first gate insulating layer 206, a first metal layer, a second gate insulating layer 207, a second metal layer, a first interlayer dielectric layer 208, the oxide active layer 222, a third gate insulating layer 209, a third metal layer, a second interlayer dielectric layer 210, a source/drain layer, and a planarization layer 212 are disposed in sequence. A material of the oxide active layer 222 may be oxide, for example, IGZO.

The driving circuit layer includes the low temperature polysilicon thin film transistor, the low temperature polycrystalline oxide thin film transistor, and a storage capacitor formed therein. In a direction far away from the substrate, the low temperature polysilicon thin film transistor includes the polysilicon active layer 214, the first gate electrode 215, the first source electrode 217, and the first drain electrode 218 in sequence, and the low temperature polycrystalline oxide thin film transistor includes the oxide active layer 222, the second gate electrode 223, the second source electrode 224, and the second drain electrode 225 in sequence. The storage capacitor includes a first electrode plate and a second electrode plate 216 in sequence. The first metal layer is patterned to form the first gate electrode 215 of the low temperature polysilicon thin film transistor and a first electrode plate (not shown) of the storage capacitor. The second metal layer is patterned to form the second electrode plate 216 of the storage capacitor. The third metal layer is patterned to form the second gate electrode 223 of the low temperature polycrystalline oxide thin film transistor. The source/drain layer is patterned to form the first source electrode 217 and the first drain electrode 218 of the low temperature polysilicon thin film transistor and the second source electrode 224 and the second drain electrode 218 of the low temperature polycrystalline oxide thin film transistor. The first source electrode 217 and the first drain electrode 218 are connected to the polysilicon active layer 214 via a through hole in the second interlayer dielectric layer 210, the third gate insulating layer 209, the first interlayer dielectric layer 208, the second gate insulating layer 207, and the first gate insulating layer 206. The second source electrode 224 and the second drain electrode 225 are connected to the oxide active layer 222 via a through hole in the second interlayer dielectric layer 210 and the third gate insulating layer 209. The second source electrode 224 or the second drain electrode 225 is connected to the polysilicon active layer 214 to implement the connection between the low temperature polysilicon thin film transistor and the low temperature polycrystalline oxide thin film transistor.

The pixel electrode layer is formed on the one side of the driving circuit layer far away from the substrate and patterned to form the pixel electrode. The pixel electrode 200 is connected to the first source electrode 217 or the first drain electrode 218.

The hydrogen blocking layer is formed on the at least one of the upper side and the lower side of the oxide active layer 222. Materials and shapes of the hydrogen blocking layer are different according to different disposing positions. The hydrogen blocking layer functions to block hydrogen ions in other film layers to invade the oxide active layer 222, so that device performance is not affected.

In one embodiment, the hydrogen blocking layer includes a first hydrogen blocking layer 10. The first hydrogen blocking layer 10 and at least one of the first metal layer and the second metal layer are disposed in the same layer. In FIG. 2, the first hydrogen blocking layer 10 and the second metal layer are disposed in the same layer. That is, the first hydrogen blocking layer 10 and the second electrode plate 216 of the storage capacitor are disposed in the same layer. A material of the first hydrogen blocking layer 10 is metal, for example, Mo.

Figure 6:
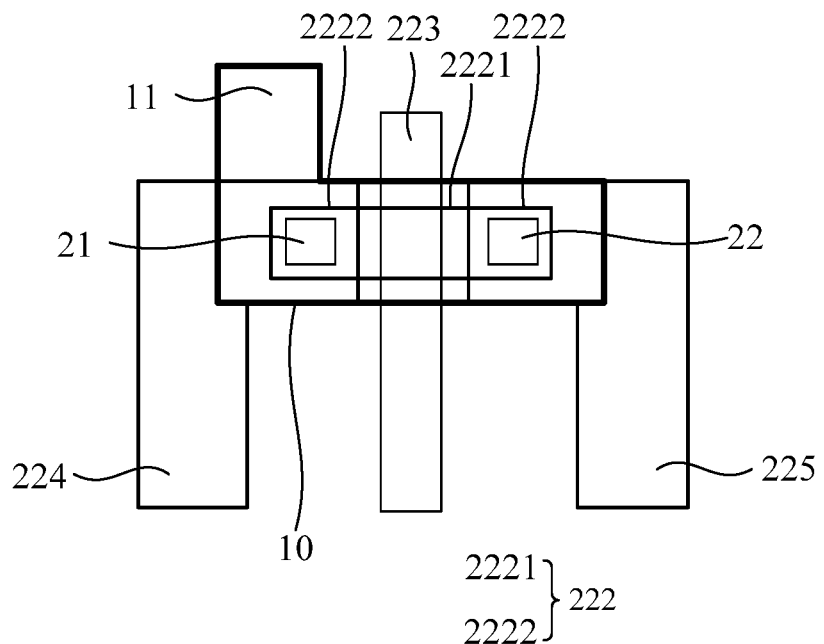
FIG. 6 illustrates a planar structure diagram of superposed film layers of an array substrate provided by an embodiment of the present disclosure.

FIG. 6 illustrates a planar structure diagram of superposed film layers of the array substrate provided by an embodiment of the present disclosure. The oxide active layer 222 includes a channel region 2221 and a doped region 2222. The second source electrode 224 is connected to the doped region 2222 via a first through hole 21. The second drain electrode 225 is connected to the doped region 2222 via a second through hole 22. A projection of the second gate electrode 223 on the substrate and a projection of the channel region 2221 on the substrate overlap with each other. A projection of the channel region 2221 on the substrate falls within a projection area of the first hydrogen blocking layer 10 on the substrate. That is, a width and a length of the first hydrogen blocking layer 10 are greater than a width and a length of the channel region of the oxide active layer 222. Accordingly, the function of blocking the hydrogen ions can be better. In one embodiment, the width of the first hydrogen blocking layer 10 is greater than the width of the channel region for 1 micrometer to 8 micrometers, and the length of the first hydrogen blocking layer 10 is greater than the width of the channel region for 1 micrometer to 10 micrometers.

In one embodiment, as shown in FIG. 6, the driving circuit layer further includes a driving signal line 11, and the driving signal line 11 is connected to the first hydrogen blocking layer 10 and configured to input a variable voltage to the first hydrogen blocking layer. The driving signal line 11 and the first hydrogen blocking layer 10 can be disposed in the same layer and connected directly or can be disposed in different layers and connected via a through hole. When the low temperature polycrystalline oxide thin film transistor is turned on, a voltage which the driving signal line 11 inputs to the first hydrogen blocking layer 10 is greater than a forward voltage inputted to the gate electrode of the low temperature polycrystalline oxide thin film transistor. When the low temperature polycrystalline oxide thin film transistor is turned off, a voltage which the driving signal line 11 inputs to the first hydrogen blocking layer 10 is also greater than a reverse voltage inputted to the gate electrode of the low temperature polycrystalline oxide thin film transistor. As such, a threshold voltage of the low temperature polycrystalline oxide thin film transistor can be adjusted. Fluctuations of threshold voltages of low temperature polycrystalline oxide thin film transistors having different widths and different lengths can be reduced. Drain-induced barrier lowering can be relieved, so that the oxide device can have a high on/off current ratio, a low subthreshold swing, and strong device stability. Signals in the driving signal line 11 are directly provided by a driving IC. When the signals are inputted, the driving IC can calculate a required adjustment value according to a drift situation of the threshold voltage detected by the driving circuit layer, and then the driving signal line 11 inputs the adjustment value to the first hydrogen blocking layer 10.

In the array substrate of the present disclosure, the driving signal line 11 and the first hydrogen blocking layer 10 are disposed in the driving circuit layer. During a manufacturing process of the array substrate, the first hydrogen blocking layer 10 can block the hydrogen ions in other film layers to invade the oxide active layer 222. During a use process of the display panel, inputting the variable voltage to the first hydrogen blocking layer 10 via the driving signal line 11 can adjust the threshold voltage. When both are used together, the stability of the array substrate is high and a product yield is increased.

Figure 7:
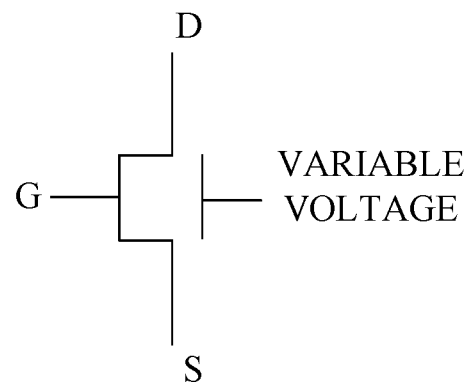
FIG. 7 illustrates a circuit structure diagram of the low temperature polycrystalline oxide thin film transistor provided by an embodiment of the present disclosure.

FIG. 7 illustrates a circuit structure diagram of the low temperature polycrystalline oxide thin film transistor provided by an embodiment of the present disclosure. G represents the second gate electrode 223. S represents the second source electrode 224. D represents the second drain electrode 225. When the low temperature polycrystalline oxide thin film transistor works, a gate driving signal is inputted to the second gate electrode 223 to control the low temperature polycrystalline oxide thin film transistor to be turned on. Then, a data signal is inputted to the second source electrode 224 or the second drain electrode 225. By disposing the first hydrogen blocking layer 10 below the oxide active layer 222 and inputting the variable voltage to the first hydrogen blocking layer 10 via the driving signal line 11, the first hydrogen blocking layer 10 functions as another gate electrode of the low temperature polycrystalline oxide thin film transistor which can complete, in combination with the second gate electrode 223, the adjustment of the threshold voltage Vth of the low temperature polycrystalline oxide thin film transistor.

In one embodiment, as shown in FIG. 2, the hydrogen blocking layer further includes a second hydrogen blocking layer 20, and the second hydrogen blocking layer 20 is formed on one side of the source/drain layer far away from the second interlayer dielectric layer 210 and covers the source/drain layer. A material of the second hydrogen blocking layer is an inorganic material and specifically includes at least one of silicon nitride and silicon oxide. Disposing the second hydrogen blocking layer 20 can block the hydrogen ions in other film layers on the oxide active layer 222 to invade and damage the oxide active layer 222. As such, the device stability of the low temperature polycrystalline oxide thin film transistor can be guaranteed.

Driving power of the low temperature polycrystalline oxide thin film transistor is lower than driving power of the low temperature polysilicon thin film transistor. When the low temperature polysilicon thin film transistor is used alone, 60 Hz is required for displaying a static image. When the low temperature polycrystalline oxide thin film transistor is used, 1 Hz is required for displaying a static image. The driving power is decreased significantly. In the array substrate in which the low temperature polycrystalline oxide thin film transistor and the low temperature polysilicon thin film transistor are connected together, a leakage current can be decreased and the driving power is decreased significantly. Furthermore, it can be appreciated from the above-mentioned embodiments that the present disclosure can block the hydrogen ions in other film layers to invade the oxide active layer 222 and avoid that device characteristics are drifted. Accordingly, the stability of the low temperature polycrystalline oxide thin film transistor is increased, and the whole performance of the device is improved.

FIG. 1 illustrates a structure diagram of a display panel in the prior art. The display panel is an OLED display panel and includes a substrate, a driving circuit layer, a pixel electrode layer, and an OLED device layer from bottom to top. The substrate includes a first flexible substrate 101, a blocking layer 102, and a second flexible substrate 103. A buffer layer 104 and a blocking layer 105 are disposed between the substrate and the driving circuit layer. The driving circuit layer includes a polysilicon active layer 114, a first gate insulating layer 106, a first metal layer, a second gate insulating layer 107, a second metal layer, a first interlayer dielectric layer 108, an oxide active layer 122, a third gate insulating layer 109, a third metal layer, a second interlayer dielectric layer 110, a source/drain layer, and a planarization layer 112 are disposed in sequence. The OLED device includes a pixel defining layer 113 and a light emitting function layer.

The driving circuit layer includes a low temperature polysilicon thin film transistor, a low temperature polycrystalline oxide thin film transistor, and a storage capacitor. In a direction far away from the substrate, the low temperature polysilicon thin film transistor includes a polysilicon active layer 114, a first gate electrode 115, a first source electrode 117, a first drain electrode 118, and a second drain electrode 119 in sequence. The low temperature polycrystalline oxide thin film transistor includes an oxide active layer 122, a second gate electrode 123, a second source electrode 124, and a second drain electrode 125 in sequence. The storage capacitor includes a first a first electrode plate and a second electrode plate 116. The first metal layer is patterned to form the first gate electrode 115 of the low temperature polysilicon thin film transistor and the first electrode plate (not shown) of the storage capacitor. The second metal layer is patterned to form the second electrode plate 116 of the storage capacitor. The third metal layer is patterned to form the second gate electrode 123 of the low temperature polycrystalline oxide thin film transistor. The first source/drain layer is patterned to form the first source electrode 117 and the first drain electrode 118 of the low temperature polysilicon thin film transistor and the second source electrode 124 and the second drain electrode 125 of the low temperature polycrystalline oxide thin film transistor. The second source/drain layer is patterned to form the second drain electrode 119 of the low temperature polysilicon thin film transistor. The pixel electrode layer is patterned to form a pixel electrode 120. The pixel electrode 120 is connected to the second drain electrode 119 via a through hole in the planarization layer 112. The first source electrode 117 and the first drain electrode 118 are connected to the polysilicon active layer 114 via a through hole in the second interlayer dielectric layer 110, the third gate insulating layer 109, the first interlayer dielectric layer 108, the second gate insulating layer 207, and the first gate insulating layer 206. The second source electrode 124 and the second drain electrode 125 are connected to the oxide active layer 122 via a through hole in the second interlayer dielectric layer 110 and the third gate insulating layer 109. The second source electrode 124 or the second drain electrode 125 is connected to the polysilicon active layer 114 to implement the connection between the low temperature polysilicon thin film transistor and the low temperature polycrystalline oxide thin film transistor.

The low temperature polysilicon thin film transistor of the display panel in FIG. 1 in the prior art has a two-layer SD structure and includes the first source/drain layer and the second source/drain layer. The two-layer SD structure requires 17-18 photomasks. This structure leads to complex product technology and a high cost. Furthermore, a yield might be decreased in each photomask manufacturing process. In FIG. 2 of the present disclosure, the low temperature polysilicon thin film transistor of the array substrate has a one-layer SD structure. That is, only one source/drain layer is included. The first drain electrode 218 is directly connected to the pixel electrode 220. This structure decreases 2 photomasks when compared with the prior art. The product technology is simple, the cost is decreased, and the product yield is increased.

In the one-layer SD structure, there are two connection manners when the first source electrode 217 and the first drain electrode 218 are connected to the polysilicon active layer 214 via the through holes.

In one embodiment, each through hole has a single-hole structure. That is, each through hole between the source/drain layer and the polysilicon active layer 214 is formed by one time of etching process. Details steps of forming the through holes are shown in FIG. 3A to FIG. 3F.

Figure 3A:
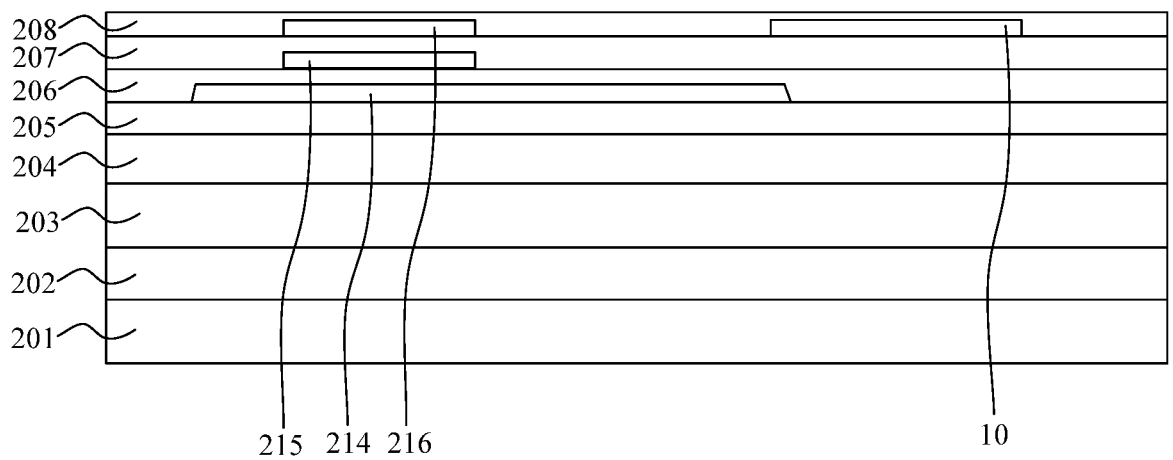
FIG. 3A to FIG. 3F illustrate a structure diagram of an array substrate in each step in a first manufacturing method provided by an embodiment of the present disclosure.

As shown in FIG. 3A, the first flexible substrate 201, the barrier layer 202, the second flexible substrate 203, the buffer layer 204, the blocking layer 205, the polysilicon active layer 214, the first gate insulating layer 206, the first metal layer, the second gate insulating layer 207, the second metal layer, and the first interlayer dielectric layer 208 are stacked up and disposed. The polysilicon active layer 214 is an active layer of the low temperature polysilicon thin film transistor. The first metal layer is patterned to form the first gate electrode 215 of the low temperature polysilicon thin film transistor and the first electrode plate (not shown) of the storage capacitor. The second metal layer is patterned to form the second electrode plate 216 of the storage capacitor and the first hydrogen blocking layer 10 of the low temperature polycrystalline oxide thin film transistor.

Figure 3B:
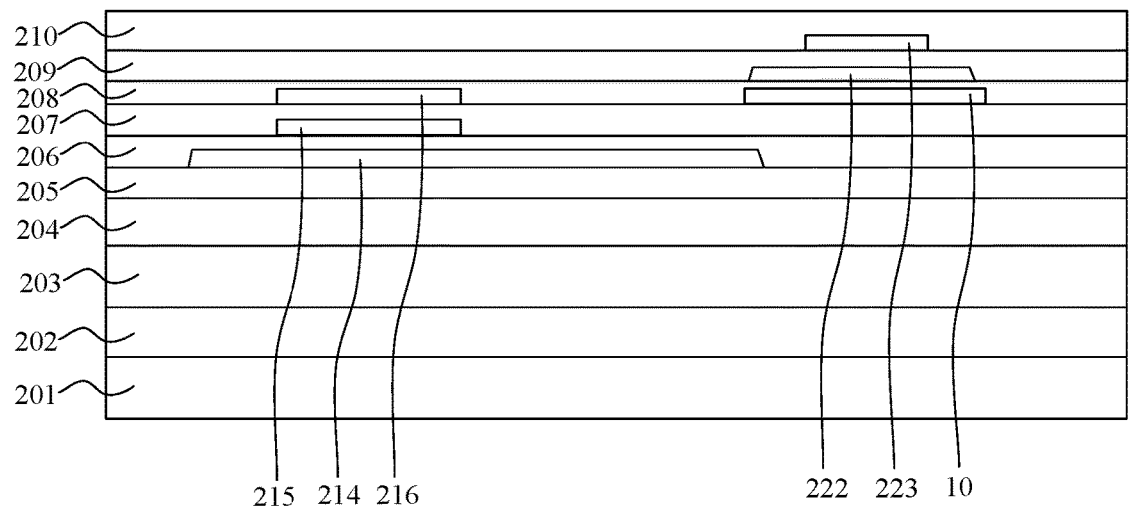

As shown in FIG. 3B, the oxide active layer 222, the third gate insulating layer 209, the third metal layer, and the second interlayer dielectric layer 210 are sequentially formed on the first interlayer dielectric layer 208. The oxide active layer 222 is an active layer of the low temperature polycrystalline oxide thin film transistor. The third metal layer is patterned to form the second gate electrode 223 of the low temperature polycrystalline oxide thin film transistor.

Figure 3C:
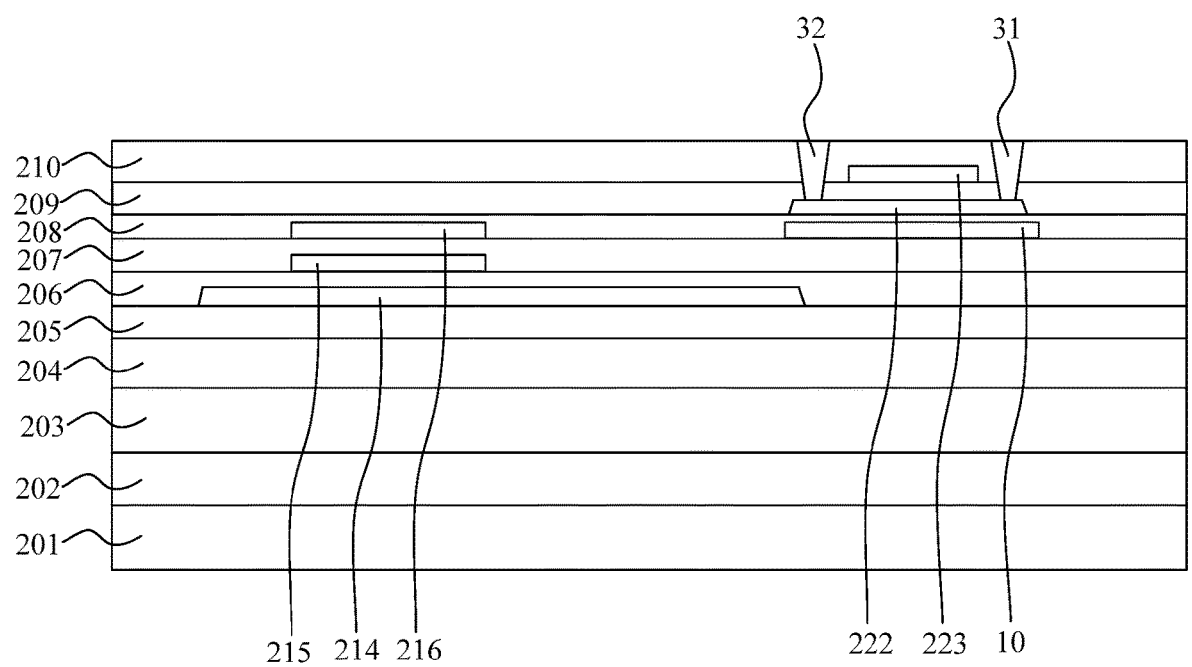

As shown in FIG. 3C, a first through hole 31 and a second through hole 32 are formed in the second interlayer dielectric layer 210 and the third gate insulating layer 209. The first through hole 31 and the second through hole 32 are connected to the oxide active layer 222. The first through hole 31 corresponds to a drain region of the oxide active layer 222. The second through hole corresponds to a source region of the oxide active layer 222.

Figure 3D:
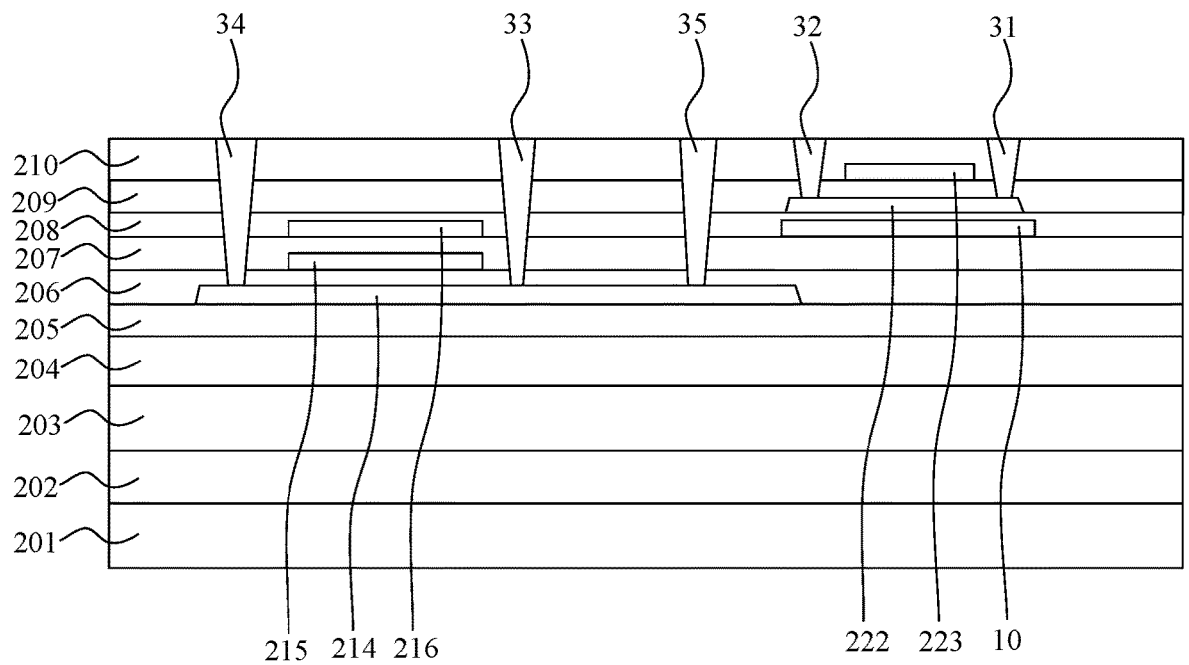

As shown in FIG. 3D, a third through hole 33, a fourth through hole 34, a fifth through hole 35 are formed in the second interlayer dielectric layer 210, the third gate insulating layer 209, the first interlayer dielectric layer 208, and the first gate insulating layer 206. The third through hole 33, the fourth through hole 34, and the fifth through hole 35 are connected to the polysilicon active layer 214. The third through hole 33 corresponds to a drain region of the polysilicon active layer 214. The fourth through hole 34 corresponds to a source region of the polysilicon active layer 214. The fifth through hole 35 corresponds to the drain region or the source region of the polysilicon active layer 214.

Figure 3E:
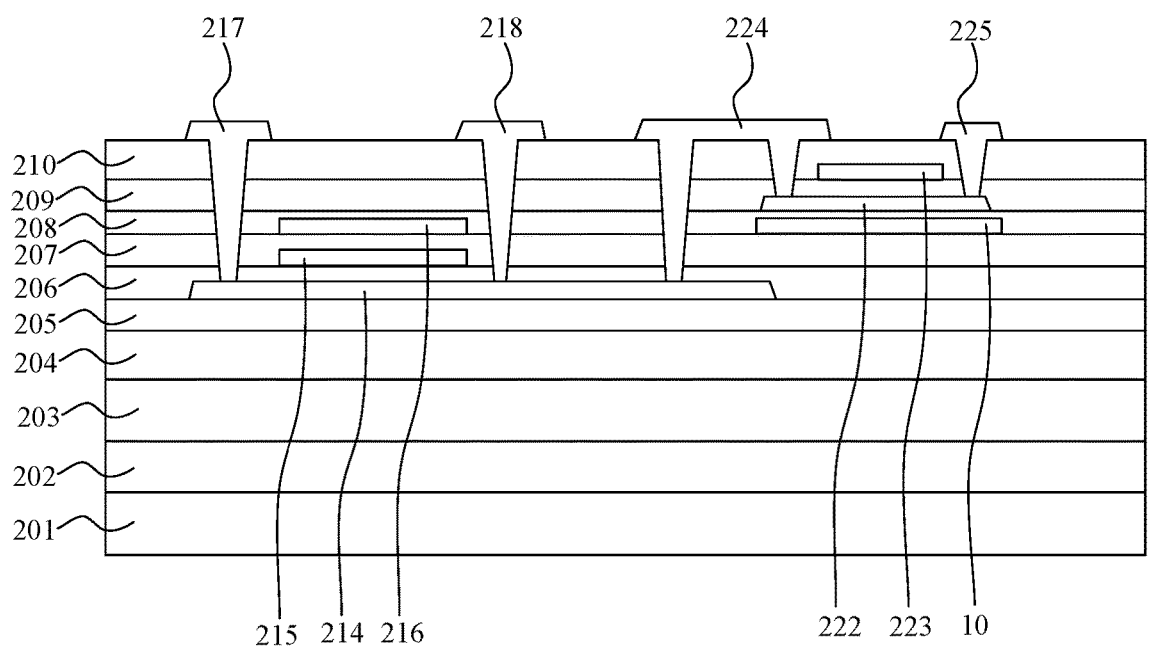

As shown in FIG. 3E, the source/drain layer is formed on the through holes and patterned to form the first source electrode 217 and the first drain electrode 218 of the low temperature polysilicon thin film transistor and the second source electrode 224 and the second drain electrode 225 of the low temperature polycrystalline oxide thin film transistor. The first source electrode 217 is connected to the polysilicon active layer 214 via the fourth through hole 34. The first drain electrode 218 is connected to the polysilicon active layer 214 via the third through hole 33. The second source electrode 224 is connected to the oxide active layer 222 via the second through hole 32 and connected to the polysilicon active layer 214 via the fifth through hole 35, thereby implementing the electrical connection between the low temperature polysilicon thin film transistor and the low temperature polycrystalline oxide thin film transistor. The second drain electrode 225 is connected to the oxide active layer 222 via the first through hole 31.

Figure 3F:
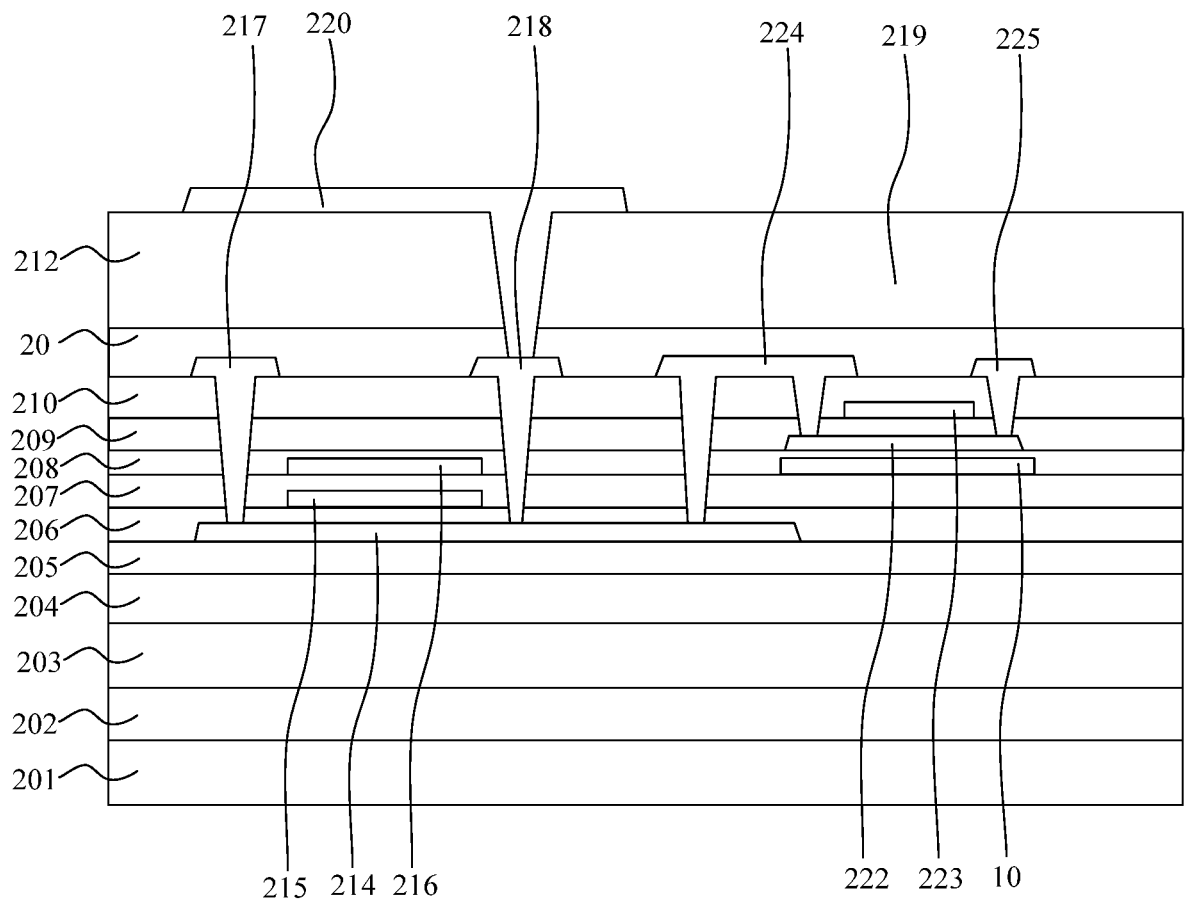

As shown in FIG. 3F, the second hydrogen blocking layer 20, the planarization layer 212, and the pixel electrode layer are formed on the source/drain layer. The pixel electrode layer is patterned to form the pixel electrode 220. The pixel electrode 220 is connected to the first source electrode 217 or the first drain electrode 218 to complete the manufacturing of the array substrate.

A stair is not formed in the first interlayer dielectric layer 208 when each through hole between the source/drain layer and the polysilicon active layer 214 is formed by the above-mentioned method. Each through hole is uniform. A taper angle of each through hole corresponding to the two transistors is ranged from 40 degrees to 80 degrees.

Figure 4:
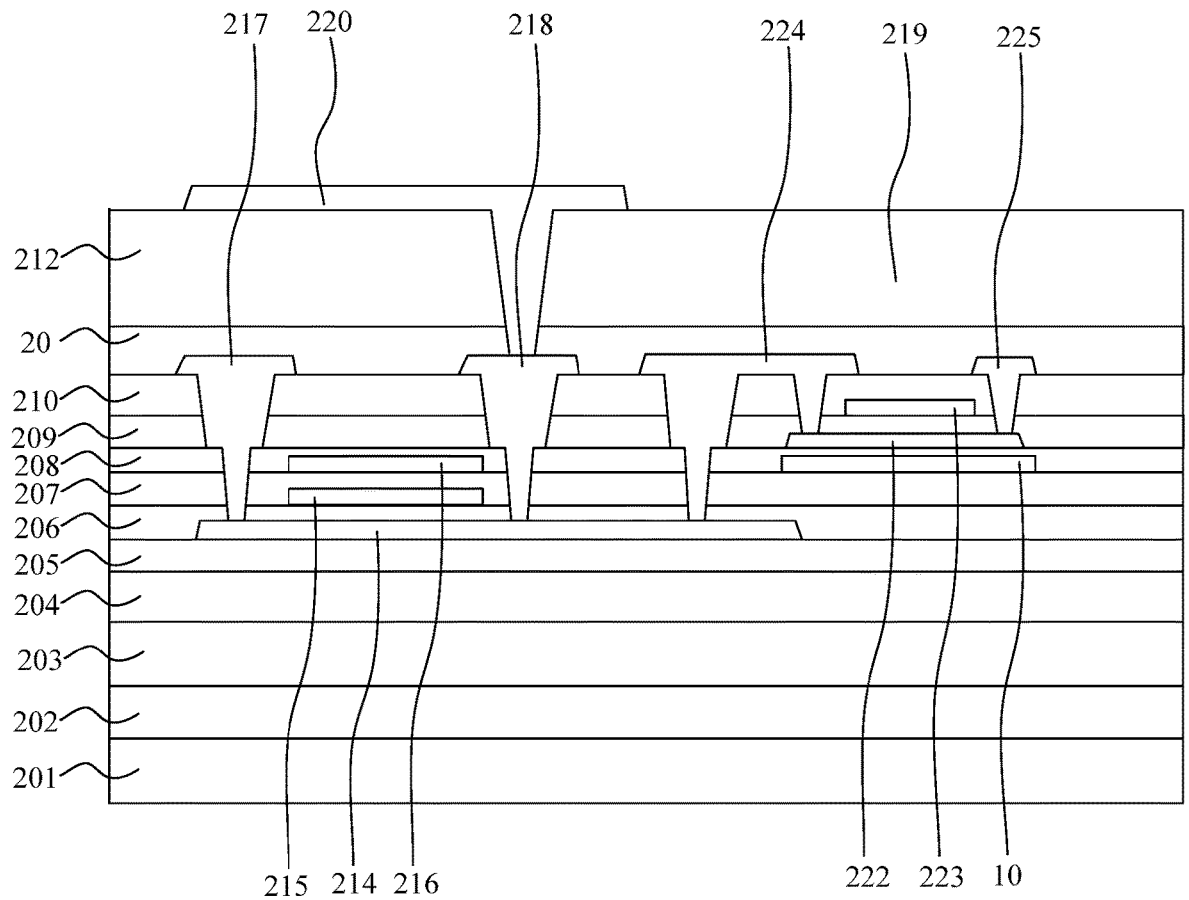
FIG. 4 illustrates a second structure diagram of an array substrate provided by an embodiment of the present disclosure.

In one embodiment, as shown in FIG. 4, each through hole has a case hole structure. That is, each through hole between the source/drain layer and the polysilicon active layer 214 is formed by two times of etching processes. Details steps of forming the through holes are shown in FIG. 5A to FIG. 5F.

Figure 5A:
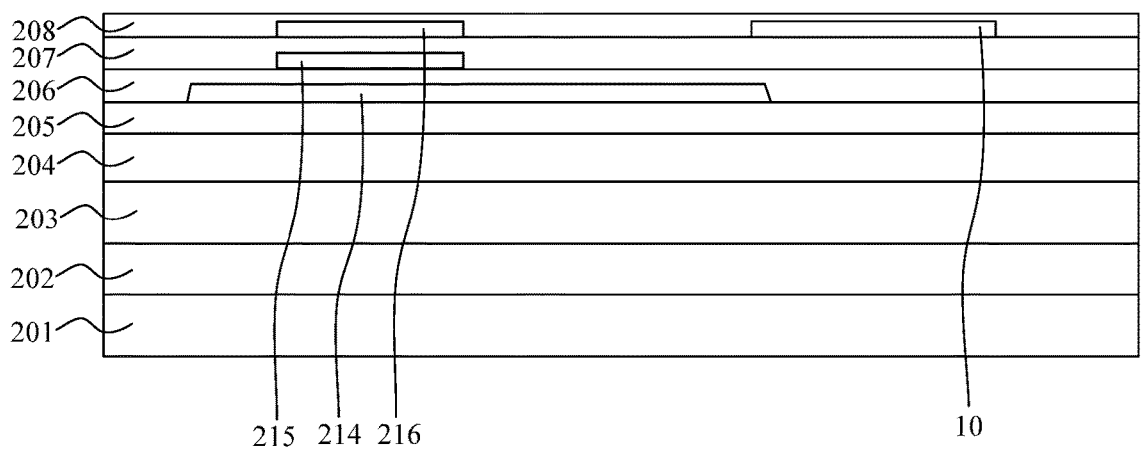
FIG. 5A to FIG. 5F illustrate a structure diagram of an array substrate in each step in a second manufacturing method provided by an embodiment of the present disclosure.

As shown in FIG. 5A, the first flexible substrate 201, the barrier layer 202, the second flexible substrate 203, the buffer layer 204, the blocking layer 205, the polysilicon active layer 214, the first gate insulating layer 206, the first metal layer, the second gate insulating layer 207, the second metal layer, and the first interlayer dielectric layer 208 are stacked up and disposed. The polysilicon active layer 214 is an active layer of the low temperature polysilicon thin film transistor. The first metal layer is patterned to form the first gate electrode 215 of the low temperature polysilicon thin film transistor and the first electrode plate (not shown) of the storage capacitor. The second metal layer is patterned to form the second electrode plate 216 of the storage capacitor and the first hydrogen blocking layer 10 of the low temperature polycrystalline oxide thin film transistor.

Figure 5B:
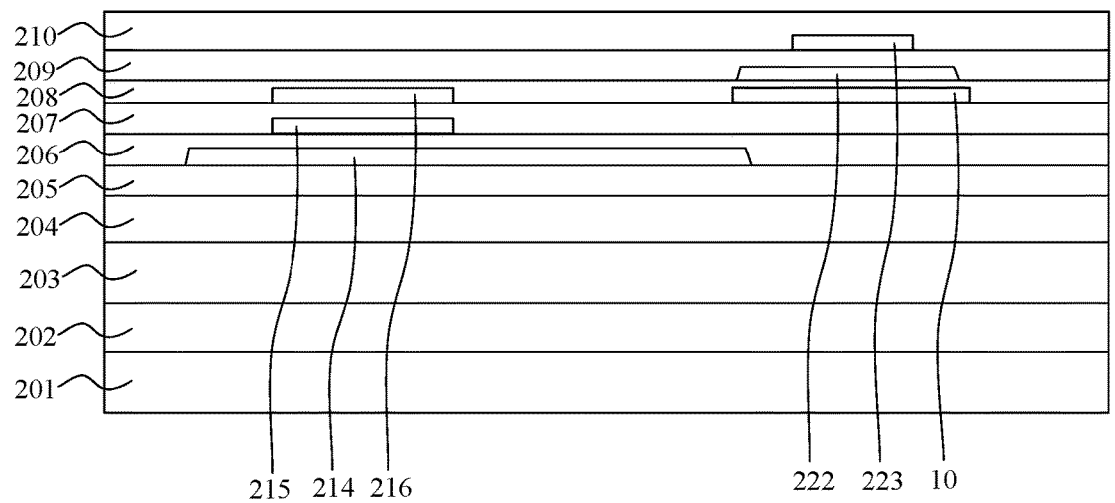

As shown in FIG. 5B, the oxide active layer 222, the third gate insulating layer 209, the third metal layer, and the second interlayer dielectric layer 210 are sequentially formed on the first interlayer dielectric layer 208. The oxide active layer 222 is an active layer of the low temperature polycrystalline oxide thin film transistor. The third metal layer is patterned to form the second gate electrode 223 of the low temperature polycrystalline oxide thin film transistor.

Figure 5C:
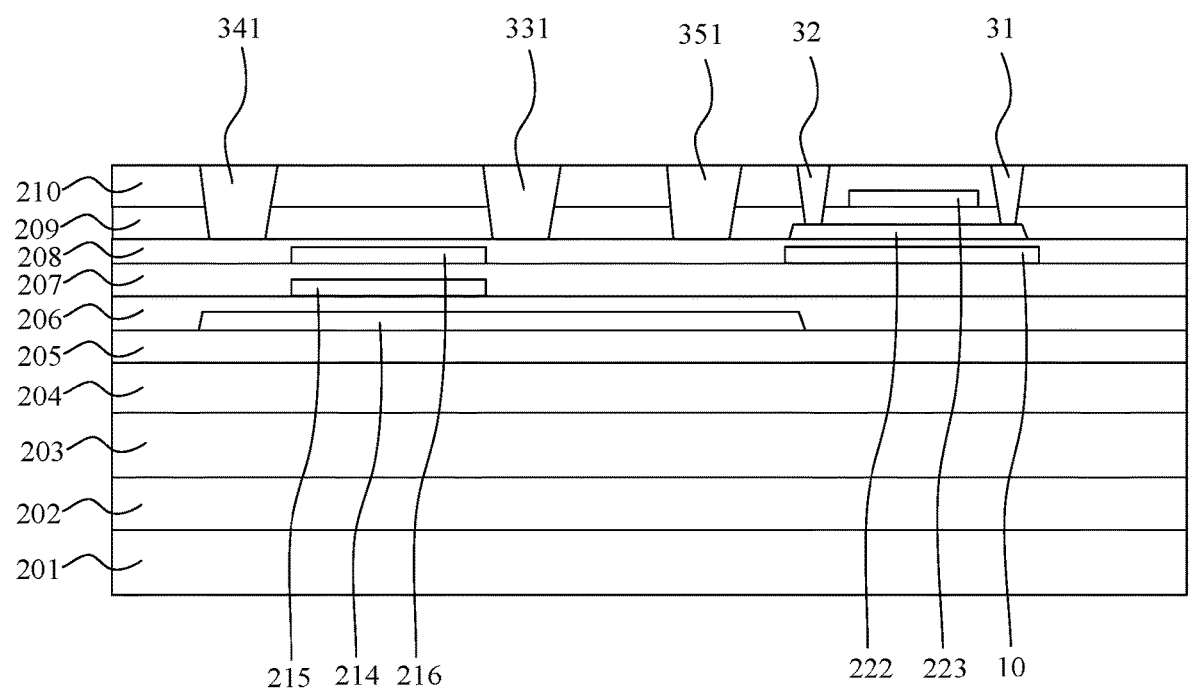

As shown in FIG. 5C, a first through hole 31, a second through hole 32, a first part 331 of a third through hole, a first part 341 of a fourth through hole, and a first part 351 of a fifth through hole are formed in the second interlayer dielectric layer 210 and the third gate insulating layer 209. The first through hole 31 and the second through hole 32 are connected to the oxide active layer 222. The first through hole 31 corresponds to a drain region of the oxide active layer 222. The second through hole corresponds to a source region of the oxide active layer 222. The first part 331 of the third through hole, the first part 341 of the fourth through hole, and the first part 351 of the fifth through hole are connected to the first interlayer dielectric layer 208. The first part 331 of the third through hole corresponds to a drain region of the polysilicon active layer 214. The first part 341 of the fourth through hole corresponds to a drain region of the polysilicon active layer 214. The first part 351 of the fifth through hole corresponds to the drain region or the source region of the polysilicon active layer 214.

Figure 5D:
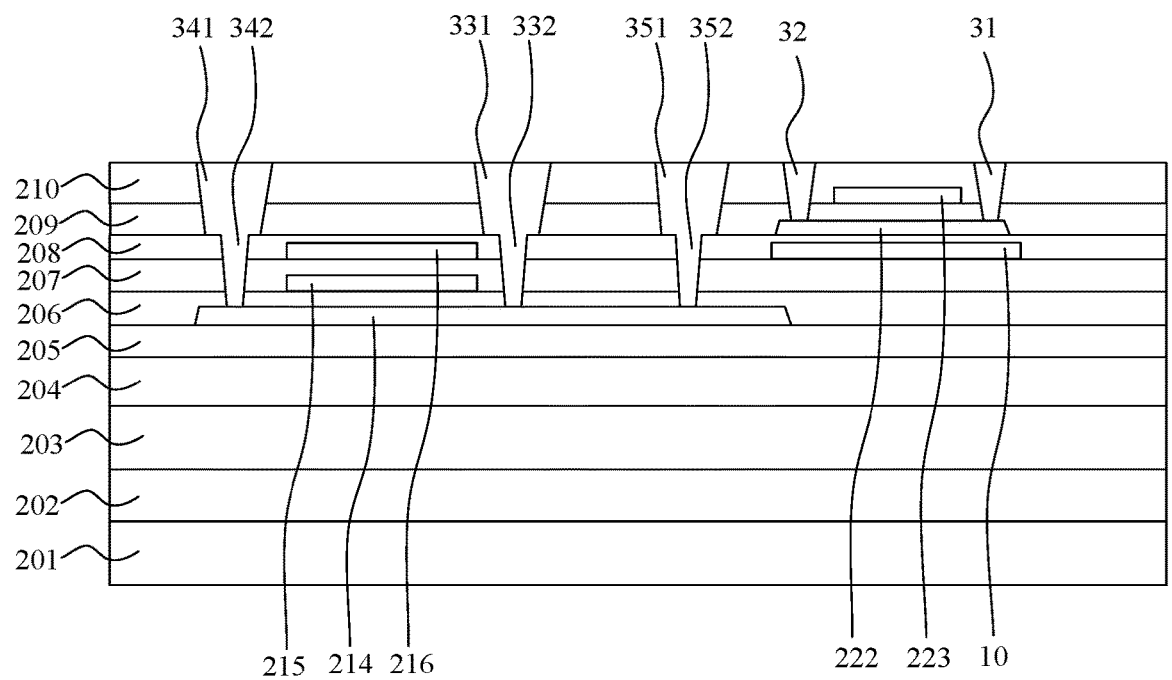

As shown in FIG. 5D, a second part 332 of the third through hole 33, a second part 342 of the fourth through hole 34, a second part 352 of the fifth through hole 35 are formed in the first interlayer dielectric layer 208 and the first gate insulating layer 206. The three through holes are connected to the polysilicon active layer 214. The first part 331 and the second part 332 of the third through hole together form the third through hole. The first part 341 and the second part 342 of the fourth through hole together form the fourth through hole. The first part 35 land the second part 352 of the fifth through hole together form the fifth through hole.

Figure 5E:
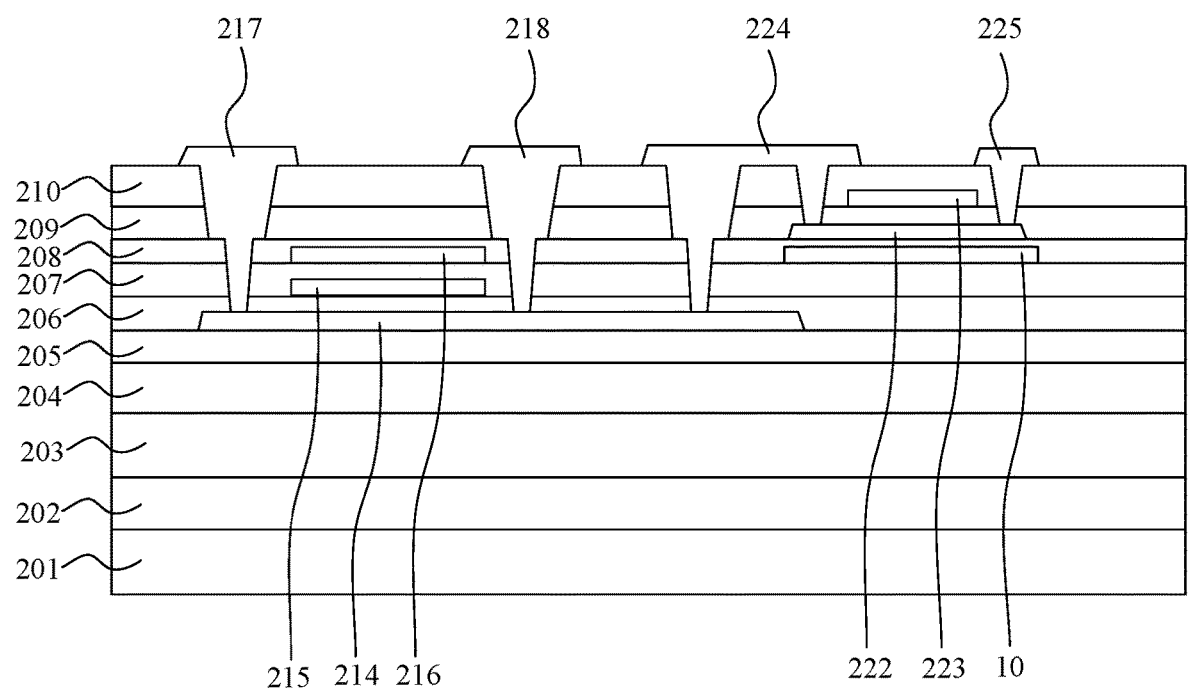

As shown in FIG. 5E, the source/drain layer is formed on the through holes and patterned to form the first source electrode 217 and the first drain electrode 218 of the low temperature polysilicon thin film transistor and the second source electrode 224 and the second drain electrode 225 of the low temperature polycrystalline oxide thin film transistor. The first source electrode 217 is connected to the polysilicon active layer 214 via the fourth through hole. The first drain electrode 218 is connected to the polysilicon active layer 214 via the third through hole. The second source electrode 224 is connected to the oxide active layer 222 via the second through hole 32 and connected to the polysilicon active layer 214 via the fifth through hole, thereby implementing the electrical connection between the low temperature polysilicon thin film transistor and the low temperature polycrystalline oxide thin film transistor. The second drain electrode 225 is connected to the oxide active layer 222 via the first through hole 31.

Figure 5F:
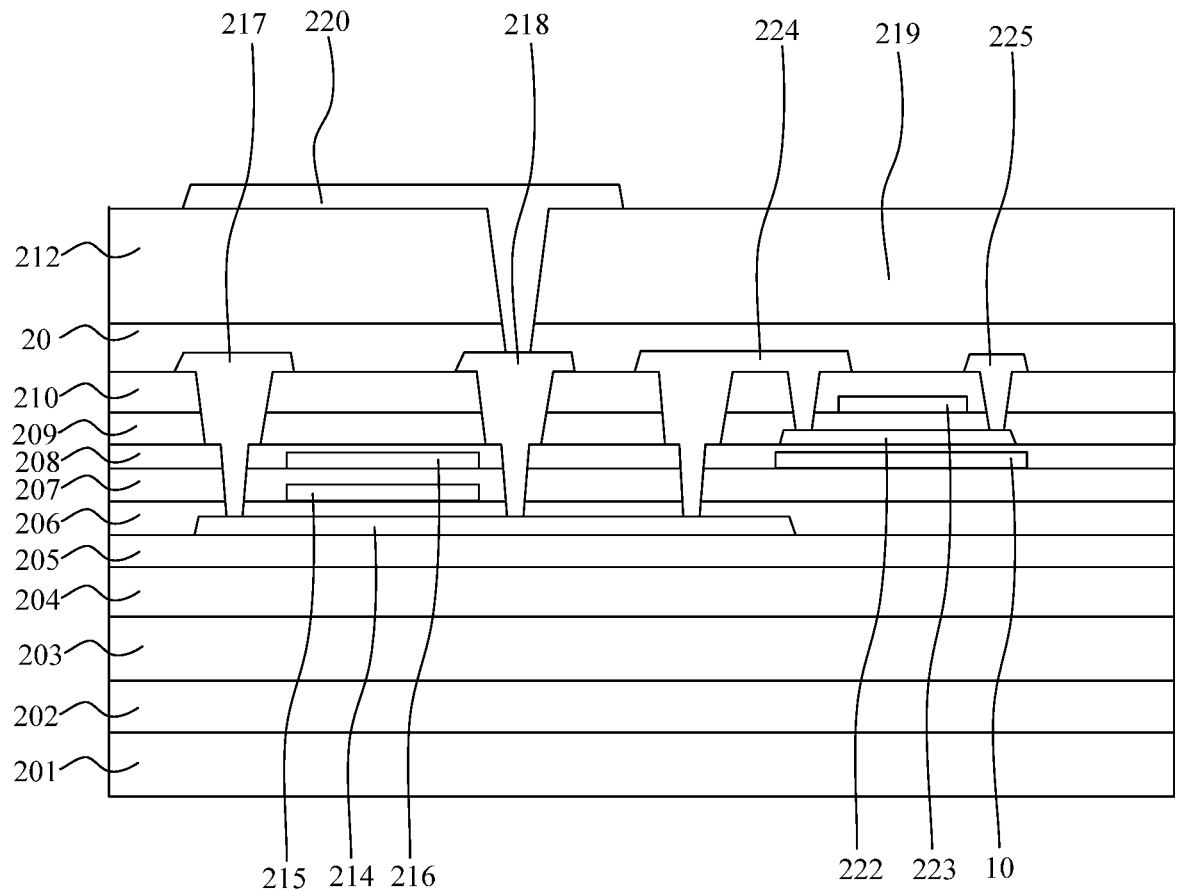

As shown in FIG. 5F, the second hydrogen blocking layer 20, the planarization layer 212, and the pixel electrode layer are formed on the source/drain layer. The pixel electrode layer is patterned to form the pixel electrode 220. The pixel electrode 220 is connected to the first source electrode 217 or the first drain electrode 218 to complete the manufacturing of the array substrate.

In the present embodiment, the third through hole, the fourth through hole, and the fifth through hole are formed by two times of etching processes. A stair is formed in each of the through holes of the low temperature polysilicon thin film transistor in the first interlayer dielectric layer 108. A shape of the through hole is a stair groove. A taper angle is ranged from 40 degrees to 80 degrees. An edge of the stair is smooth, so that a data line can be disposed in the source/drain layer conveniently. Furthermore, the stair can distinguish the two times of etching processes.

In the array substrate of the present disclosure, only one source/drain layer is disposed. Furthermore, there are two connection manners when the source/drain layer is connected to the polysilicon active layer 214. This structure decreases 2 photomasks, simplifies the technology, decreases the cost, and increases the product yield, when compared with the prior art.

The present disclosure further provides a display panel including the array substrate of any one of the above-mentioned embodiments. The display panel is an OLED display panel.

Figure 8:
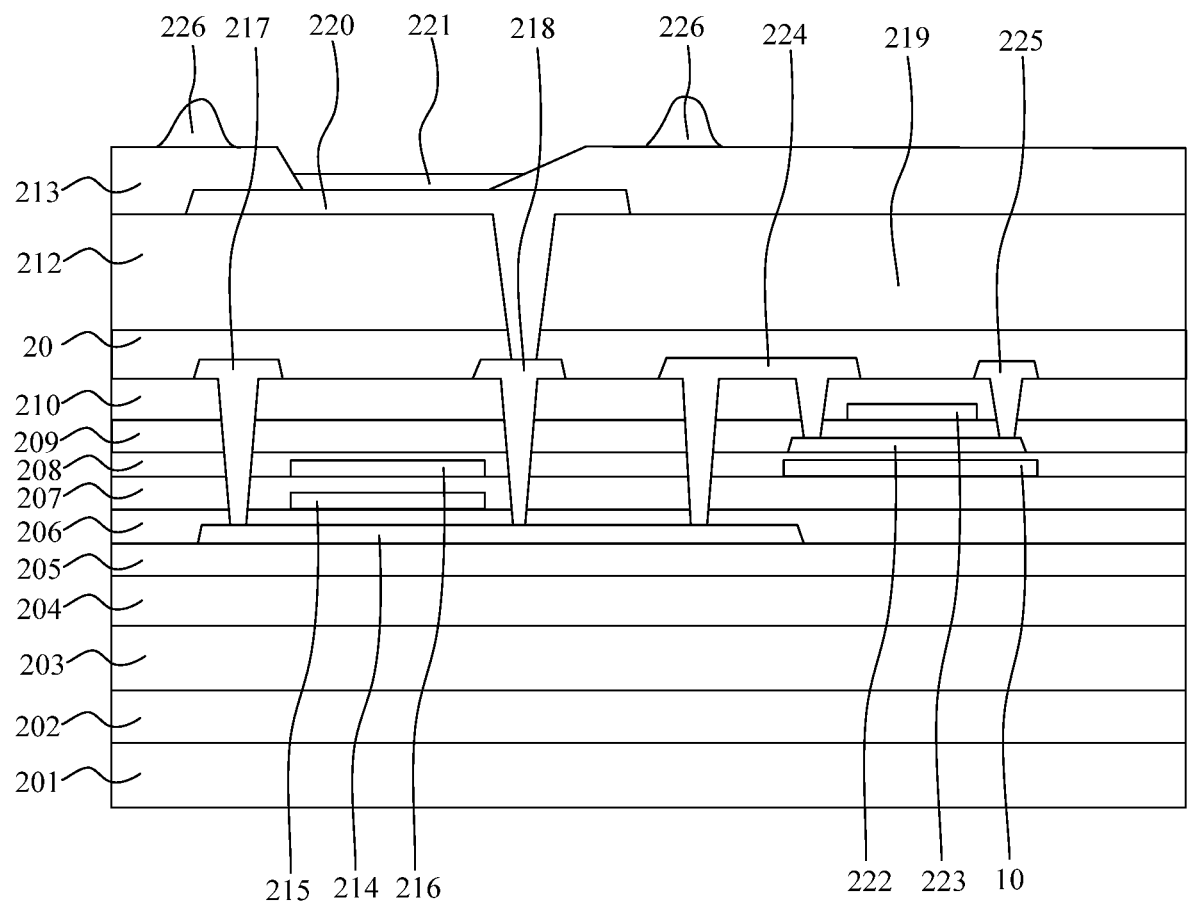
FIG. 8 illustrates a first structure diagram of a display panel provided by an embodiment of the present disclosure.
Figure 9:
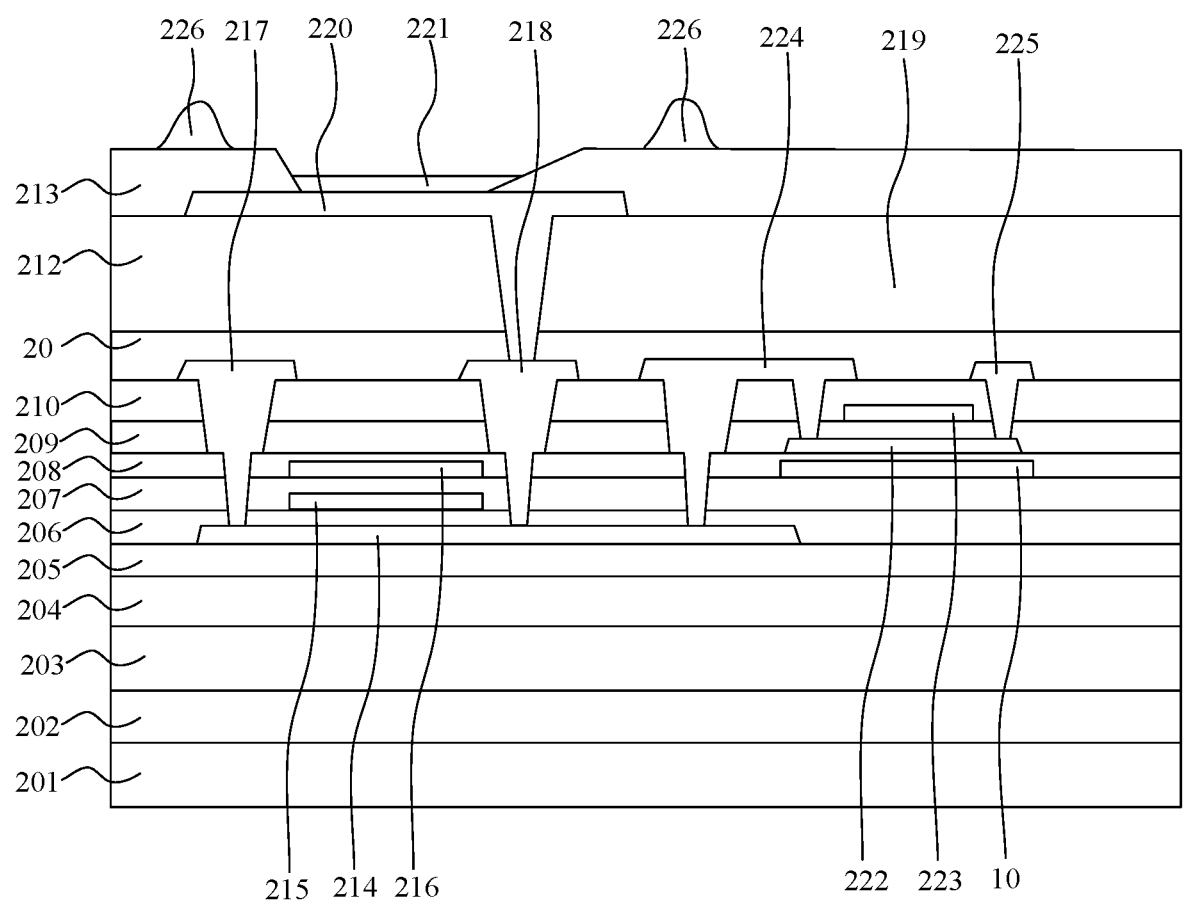
FIG. 9 illustrates a second structure diagram of a display panel provided by an embodiment of the present disclosure.

As shown in FIG. 8 and FIG. 9, the display panel is an OLED display panel including an array substrate and an OLED device layer. The OLED device includes a pixel defining layer 213, a light emitting function layer 221, and a common electrode layer (not shown) which are formed on a pixel electrode layer. Furthermore, walls 226 are disposed on the pixel defining layer 213. In one embodiment, a protective layer (not shown) is formed on one side of the common electrode layer far away from the light emitting function layer 221, and the protective layer covers the common electrode layer. A material of the protective layer is a simple substance metal, for example, magnesium, aluminum, silver, or gallium. Alternatively, the protective layer may be an active metal simple substance. The protective layer is formed by an evaporation method or a sputtering method, and thus a thickness of the protective layer is thin. When the display panel is packaged, an inorganic-organic-inorganic structure is used. When an inorganic encapsulation layer is formed, oxygenated precursor gas, for example, $N_2O$ is usually required. The protective layer is a simple substance metal. When the oxygenated precursor gas contacts the protective layer, the protective layer is oxidized to metal oxide. The metal oxide usually has a compact structure. As such, the protective layer functions as a passivation layer to prevent the metal film layers of the transistors in the array substrate from being oxidized. The protective layer and the hydrogen blocking layer cooperate with each other to increase the stability of the OLED display panel.

In one embodiment, a first opening for defining a pixel region is formed in a position of the pixel defining layer 213 corresponding to a light emitting region. A second opening for defining a reflection region is formed in a position of the pixel defining layer 213 corresponding to the low temperature polysilicon thin film transistor and the low temperature polycrystalline oxide thin film transistor. A material of the common electrode layer is an opaque material. The common electrode layer in the second opening is configured to reflect light emitted from the light emitting function layer. The second opening for defining the reflection region is formed by removing the pixel defining layer on the thin film transistors, so that the second opening of the pixel defining layer is filled with the common electrode layer. Accordingly, when light is upwardly emitted to the common electrode layer, the common electrode layer in the second opening can reflect light back, thereby avoiding that the light is reflected to the low temperature polysilicon thin film transistor and the low temperature polycrystalline oxide thin film transistor. The common electrode layer and the hydrogen blocking layer can cooperate with each other to increase the stability of the low temperature polycrystalline oxide thin film transistor.

It can be appreciated from the above-mentioned embodiments as follows.

The present disclosure provides an array substrate and a display panel. The array substrate includes a substrate, a driving circuit layer, a hydrogen blocking layer, and a pixel electrode layer. The driving circuit layer is formed on one side of the substrate and includes a low temperature polysilicon thin film transistor and a low temperature polycrystalline oxide thin film transistor which are electrically connected with each other. In a direction far away from the substrate, the low temperature polysilicon thin film transistor includes a polysilicon active layer, a first gate electrode, a first source electrode, and a first drain electrode in sequence. The low temperature polycrystalline oxide thin film transistor includes an oxide active layer, a second gate electrode, a second source electrode, and a second drain electrode in sequence. The first source electrode and the first drain electrode are connected to the polysilicon active layer. The second source electrode and the second drain electrode are connected to the oxide active layer. The hydrogen blocking layer is formed on at least one of an upper side and a lower side of the oxide active layer. The pixel electrode layer is formed on one side of the driving circuit layer far away from the substrate. The pixel electrode layer is patterned to form a pixel electrode. The pixel electrode is connected to the first source electrode or the first drain electrode. In the present disclosure, the low temperature polysilicon thin film transistor and the low temperature polycrystalline oxide thin film transistor are electrically connected with each other, and thus the driving power of the device can be decreased. The disposed hydrogen blocking layer can block hydrogen ions in other film layers to invade the oxide active layer and avoid that device characteristics are drifted. Accordingly, the stability of the thin film transistors in the array substrate is increased, and the performance of the device is improved.

In the foregoing embodiments, the description of the various embodiments has respective different emphases, and a part in some embodiment, which is not described in detail can be referred to the related description of other embodiments.

The array substrate and the display panel provided by the embodiments of the present disclosure are described in detail as above. The embodiments are used to describe the principle and the implementations of the present disclosure. It should be understood that the present disclosure is not limited to the exemplary examples. Those skilled in the art may achieve equivalent improvements or replacements according to the above description. The equivalent improvements and replacements should be considered to belong to the protection scope of the present disclosure.

What is claimed is:

1. An array substrate, comprising:
a substrate;
a driving circuit layer formed on the substrate and comprising a low temperature polysilicon thin film transistor and a low temperature polycrystalline oxide thin film transistor which are electrically connected with each other, wherein the low temperature polysilicon thin film transistor comprises a polysilicon active layer, a first gate electrode, a first source electrode, and a first drain electrode; the low temperature polycrystalline oxide thin film transistor comprises an oxide active layer, a second gate electrode, a second source electrode, and a second drain electrode; the driving circuit layer comprises the polysilicon active layer, a first gate insulating layer, the first gate electrode, a second gate insulating layer, a first interlayer dielectric layer, the oxide active layer, a third gate insulating layer, the second gate electrode, a second interlayer dielectric layer, and a source/drain layer in sequence from bottom to top; the source/drain layer comprises the first source electrode, the first drain electrode, the second source electrode, and the second drain electrode; the first source electrode is connected to the polysilicon active layer through a first through hole; the first drain electrode is connected to the polysilicon active layer through a second through hole; the second source electrode is directly connected to the polysilicon active layer through a third through hole; the first through hole, the second through hole, and the third through hole have a stair at the first interlayer dielectric layer and have a taper angle of 40° to 80°, and an edge of the stair is smooth;
a hydrogen blocking layer formed on at least one of an upper side and a lower side of the oxide active layer; and
a pixel electrode disposed on one side of the driving circuit layer away from the substrate and directly connected to the first source electrode or the first drain electrode.

2. The array substrate of claim 1, wherein the driving circuit layer further comprises a storage capacitor; the storage capacitor comprises a first electrode plate and a second electrode plate, the first electrode plate is disposed on a same layer as the first gate electrode, the second electrode plate is disposed above the first gate electrode, the hydrogen blocking layer comprises a first hydrogen blocking layer, and the first hydrogen blocking layer is disposed on a same layer as the first gate electrode or the second electrode plate.

3. The array substrate of claim 2, wherein a material of the first hydrogen blocking layer is metal.

4. The array substrate of claim 2, wherein the oxide active layer comprises a channel region and a doped region, and a projection of the channel region on the substrate completely falls within a projection area of the first hydrogen blocking layer on the substrate.

5. The array substrate of claim 4, wherein a width of the first hydrogen blocking layer is greater than a width of the channel region for 1 micrometer to 8 micrometers, and a length of the first hydrogen blocking layer is greater than a width of the channel region for 1 micrometer to 10 micrometers.

6. The array substrate of claim 2, wherein the driving circuit layer further comprises a driving signal line, and the driving signal line is connected to the first hydrogen blocking layer and configured to input a variable voltage to the first hydrogen blocking layer.

7. The array substrate of claim 1, wherein
the hydrogen blocking layer comprises a second hydrogen blocking layer, and the second hydrogen blocking layer is formed on one side of the source/drain layer away from the second interlayer dielectric layer.

8. The array substrate of claim 7, wherein the second hydrogen blocking layer covers the source/drain layer.

9. The array substrate of claim 7, wherein a material of the second hydrogen blocking layer is an inorganic material.

10. The array substrate of claim 9, wherein the material of the second hydrogen blocking layer comprises at least one of silicon nitride and silicon oxide.

11. A display panel, comprising an array substrate, wherein the array substrate comprises:
a substrate;
a driving circuit layer formed on the substrate and comprising a low temperature polysilicon thin film transistor and a low temperature polycrystalline oxide thin film transistor which are electrically connected with each other, wherein the low temperature polysilicon thin film transistor comprises a polysilicon active layer, a first gate electrode, a first source electrode, and a first drain electrode; the low temperature polycrystalline oxide thin film transistor comprises an oxide active layer, a second gate electrode, a second source electrode, and a second drain electrode; the driving circuit layer comprises the polysilicon active layer, a first gate insulating layer, the first gate electrode, a second gate insulating layer, a first interlayer dielectric layer, the oxide active layer, a third gate insulating layer, the second gate electrode, a second interlayer dielectric layer, and a source/drain layer in sequence from bottom to top; the source/drain layer comprises the first source electrode, the first drain electrode, the second source electrode, and the second drain electrode; the first source electrode is connected to the polysilicon active layer through a first through hole; the first drain electrode is connected to the polysilicon active layer through a second through hole; the second source electrode is directly connected to the polysilicon active layer through a third through hole; the first through hole, the second through hole, and the third through hole have a stair at the first interlayer dielectric layer and have a taper angle of 40° to 80°, and an edge of the stair is smooth;
a hydrogen blocking layer formed on at least one of an upper side and a lower side of the oxide active layer; and
a pixel electrode disposed on one side of the driving circuit layer away from the substrate and directly connected to the first source electrode or the first drain electrode.

12. The display panel of claim 11, wherein the driving circuit layer further comprises a storage capacitor; the storage capacitor comprises a first electrode plate and a second electrode plate, the first electrode plate is disposed on a same layer as the first gate electrode, the second electrode plate is disposed above the first gate electrode, the hydrogen blocking layer comprises a first hydrogen blocking layer, and the first hydrogen blocking layer is disposed on a same layer as the first gate electrode or the second electrode plate.

13. The display panel of claim 12, wherein a material of the first hydrogen blocking layer is metal.

14. The display panel of claim 12, wherein the oxide active layer comprises a channel region and a doped region, and a projection of the channel region on the substrate completely falls within a projection area of the first hydrogen blocking layer on the substrate.

15. The display panel of claim 14, wherein a width of the first hydrogen blocking layer is greater than a width of the channel region for 1 micrometer to 8 micrometers, and a length of the first hydrogen blocking layer is greater than a width of the channel region for 1 micrometer to 10 micrometers.

16. The display panel of claim 12, wherein the driving circuit layer further comprises a driving signal line, and the driving signal line is connected to the first hydrogen blocking layer and configured to input a variable voltage to the first hydrogen blocking layer.

17. The display panel of claim 11, wherein
the hydrogen blocking layer comprises a second hydrogen blocking layer, and the second hydrogen blocking layer is formed on one side of the source/drain layer away from the second interlayer dielectric layer.

18. The display panel of claim 17, wherein the second hydrogen blocking layer covers the source/drain layer.

19. The display panel of claim 17, wherein a material of the second hydrogen blocking layer is an inorganic material.

20. The display panel of claim 19, wherein the material of the second hydrogen blocking layer comprises at least one of silicon nitride and silicon oxide.

* * * * *